United States Patent
Suto et al.

(10) Patent No.: US 9,977,052 B2
(45) Date of Patent: May 22, 2018

(54) TEST FIXTURE

(71) Applicant: Teradyne, Inc., North Reading, MA (US)

(72) Inventors: Anthony J. Suto, Sterling, MA (US); Joseph Francis Wrinn, Winchester, MA (US); John P. Toscano, Auburn, MA (US); John Joseph Arena, Reading, MA (US)

(73) Assignee: Teradyne, Inc., North Reading, MA (US)

( * ) Notice: Subject to any disclaimer, the term of this patent is extended or adjusted under 35 U.S.C. 154(b) by 101 days.

(21) Appl. No.: 15/285,090

(22) Filed: Oct. 4, 2016

(65) Prior Publication Data

US 2018/0095109 A1    Apr. 5, 2018

(51) Int. Cl.
  *G01R 1/04*  (2006.01)
  *G01R 31/28*  (2006.01)

(52) U.S. Cl.
  CPC ....... *G01R 1/0416* (2013.01); *G01R 31/2806* (2013.01)

(58) Field of Classification Search
  CPC .............. G01R 1/0433; G01R 31/2893; G01R 31/2886
  See application file for complete search history.

(56) References Cited

U.S. PATENT DOCUMENTS

| | | | |
|---|---|---|---|
| 3,516,077 A | 6/1970 | Bobeck et al. | |
| 3,577,131 A | 5/1971 | Morrow et al. | |
| 3,673,433 A | 6/1972 | Kupfer | |
| 3,934,236 A | 1/1976 | Aiken et al. | |
| 4,021,790 A | 5/1977 | Aiken et al. | |
| 4,117,543 A | 9/1978 | Minnick et al. | |
| 4,692,839 A | 9/1987 | Lee et al. | |

(Continued)

FOREIGN PATENT DOCUMENTS

| | | |
|---|---|---|
| EP | 0298219 A2 | 1/1989 |
| EP | 0361779 A1 | 4/1990 |

(Continued)

OTHER PUBLICATIONS

Brunner et al., Electron-Beam MCM Testing and Probing, IEEE Transactions on Components, Packaging, Manufacturing Technology—Part B: Advanced Packaging, 17(1): 62-68 (1994).

(Continued)

*Primary Examiner* — Jermele M Hollington
*Assistant Examiner* — Alvaro Fortich
(74) *Attorney, Agent, or Firm* — Choate, Hall & Stewart LLP

(57) ABSTRACT

An example test fixture, which interfaces a tester and a unit under test (UUT), includes the following: first electrical contacts that face the tester; second electrical contacts that face the UUT; a substrate made of sections of printed first material, with the first material being electrically non-conductive, and with the substrate being between the first electrical contacts and the second electrical contacts; and structures through the substrate, with the structures including sections of second material, with the second material being electrically conductive, and with at least one of the structures electrically connecting a first electrical contact and a second electrical contact.

24 Claims, 6 Drawing Sheets

(56) References Cited

U.S. PATENT DOCUMENTS

| | | |
|---|---|---|
| 4,729,166 A | 3/1988 | Lee et al. |
| 4,754,546 A | 7/1988 | Lee et al. |
| 4,757,256 A | 7/1988 | Whann et al. |
| 4,758,785 A | 7/1988 | Rath |
| 4,778,950 A | 10/1988 | Lee et al. |
| 4,804,132 A | 2/1989 | DiFrancesco |
| 4,912,399 A | 3/1990 | Greub et al. |
| 4,918,383 A | 4/1990 | Huff et al. |
| 4,920,574 A | 4/1990 | Yamamoto et al. |
| 4,922,192 A | 5/1990 | Gross et al. |
| 4,954,873 A | 9/1990 | Lee et al. |
| 4,975,638 A | 12/1990 | Evans et al. |
| 4,980,637 A | 12/1990 | Huff et al. |
| 5,020,219 A | 6/1991 | Leedy |
| 5,072,176 A | 12/1991 | Miller et al. |
| 5,083,697 A | 1/1992 | Difrancesco |
| 5,103,577 A | 4/1992 | Michaels et al. |
| 5,132,613 A | 7/1992 | Papae et al. |
| 5,180,977 A | 1/1993 | Huff |
| 5,264,787 A | 11/1993 | Woith et al. |
| 5,355,079 A | 10/1994 | Evans et al. |
| 5,378,982 A | 1/1995 | Feigenbaum et al. |
| 5,416,429 A | 5/1995 | McQuade et al. |
| 5,422,574 A | 6/1995 | Kister |
| 5,456,404 A | 10/1995 | Robinette, Jr. et al. |
| 5,468,157 A | 11/1995 | Roebuck et al. |
| 5,469,072 A | 11/1995 | Williams et al. |
| 5,623,213 A | 4/1997 | Liu et al. |
| 5,914,613 A | 6/1999 | Gleason et al. |
| 5,968,282 A | 10/1999 | Yamasaka |
| 5,973,405 A | 10/1999 | Keukelaar et al. |
| 6,047,469 A | 4/2000 | Luna |
| 6,246,245 B1 | 6/2001 | Akram et al. |
| 6,256,882 B1 | 7/2001 | Gleason et al. |
| 6,307,387 B1 | 10/2001 | Gleason et al. |
| 6,356,098 B1 | 3/2002 | Akram et al. |
| 6,359,337 B1 | 3/2002 | Keukelaar et al. |
| 6,437,584 B1 | 8/2002 | Gleason et al. |
| 6,494,734 B1 | 12/2002 | Shuey |
| 6,499,216 B1 | 12/2002 | Fjelstad |
| 6,566,898 B2 | 5/2003 | Theissen et al. |
| 6,578,264 B1 | 6/2003 | Gleason et al. |
| 6,586,955 B2 | 7/2003 | Fjelstad et al. |
| 6,633,175 B1 | 10/2003 | Evans et al. |
| 6,661,244 B2 | 12/2003 | McQuade et al. |
| 6,686,732 B2 | 2/2004 | Parrish |
| 6,690,186 B2 | 2/2004 | Fjelstad |
| 6,708,386 B2 | 3/2004 | Gleason et al. |
| 6,756,797 B2 | 6/2004 | Brandorff et al. |
| 6,825,677 B2 | 11/2004 | Gleason et al. |
| 6,838,890 B2 | 1/2005 | Tervo et al. |
| 6,860,009 B2 | 3/2005 | Gleason et al. |
| 6,911,835 B2 | 6/2005 | Chraft et al. |
| 6,927,585 B2 | 8/2005 | Gleason et al. |
| 6,927,586 B2 | 8/2005 | Thiessen |
| 6,930,498 B2 | 8/2005 | Tervo et al. |
| 6,965,244 B2 | 11/2005 | Miller |
| 7,084,657 B2 | 8/2006 | Matsumura |
| 7,109,731 B2 | 9/2006 | Gleason et al. |
| 7,148,711 B2 | 12/2006 | Tervo et al. |
| 7,161,363 B2 | 1/2007 | Gleason et al. |
| 7,178,236 B2 | 2/2007 | Gleason et al. |
| 7,227,371 B2 | 6/2007 | Miller |
| 7,233,160 B2 | 6/2007 | Hayden et al. |
| 7,266,889 B2 | 9/2007 | Gleason et al. |
| 7,271,603 B2 | 9/2007 | Gleason et al. |
| 7,285,969 B2 | 10/2007 | Hayden et al. |
| 7,304,488 B2 | 12/2007 | Gleason et al. |
| 7,355,420 B2 | 4/2008 | Smith et al. |
| 7,368,927 B2 | 5/2008 | Smith et al. |
| 7,400,155 B2 | 7/2008 | Gleason et al. |
| 7,403,025 B2 | 7/2008 | Tervo et al. |
| 7,403,028 B2 | 7/2008 | Campbell |
| 7,417,446 B2 | 8/2008 | Hayden et al. |
| 7,420,381 B2 | 9/2008 | Burcham et al. |
| 7,427,868 B2 | 9/2008 | Strid et al. |
| 7,436,194 B2 | 10/2008 | Gleason et al. |
| 7,443,181 B2 | 10/2008 | Miller |
| 7,443,186 B2 | 10/2008 | Strid et al. |
| 7,449,899 B2 | 11/2008 | Campbell et al. |
| 7,453,275 B2 | 11/2008 | Yamaguchi |
| 7,453,276 B2 | 11/2008 | Hayden et al. |
| 7,456,646 B2 | 11/2008 | Hayden et al. |
| 7,482,823 B2 | 1/2009 | Gleason et al. |
| 7,489,149 B2 | 2/2009 | Gleason et al. |
| 7,492,175 B2 | 2/2009 | Smith et al. |
| 7,495,461 B2 | 2/2009 | Hayden et al. |
| 7,498,829 B2 | 3/2009 | Gleason et al. |
| 7,501,842 B2 | 3/2009 | Gleason et al. |
| 7,504,842 B2 | 3/2009 | Schwindt |
| 7,514,944 B2 | 4/2009 | Smith et al. |
| 7,518,387 B2 | 4/2009 | Gleason et al. |
| 7,533,462 B2 | 5/2009 | Gleason et al. |
| 7,535,247 B2 | 5/2009 | Andrews et al. |
| 7,541,821 B2 | 6/2009 | Gleason et al. |
| 7,601,039 B2 | 10/2009 | Eldridge et al. |
| 7,609,077 B2 | 10/2009 | Campbell et al. |
| 7,619,419 B2 | 11/2009 | Campbell |
| 7,656,172 B2 | 2/2010 | Andrews et al. |
| 7,681,312 B2 | 3/2010 | Gleason et al. |
| 7,688,097 B2 | 3/2010 | Hayden et al. |
| 7,723,999 B2 | 5/2010 | Strid et al. |
| 7,750,652 B2 | 7/2010 | Campbell |
| 7,759,953 B2 | 7/2010 | Strid et al. |
| 7,761,983 B2 | 7/2010 | Hayden et al. |
| 7,761,986 B2 | 7/2010 | Gleason et al. |
| 7,764,072 B2 | 7/2010 | Strid et al. |
| 7,764,075 B2 | 7/2010 | Miller |
| 7,791,361 B2 | 9/2010 | Karklin et al. |
| 7,800,001 B2 | 9/2010 | Hamada et al. |
| 7,876,114 B2 | 1/2011 | Campbell et al. |
| 7,888,957 B2 | 2/2011 | Smith et al. |
| 7,893,704 B2 | 2/2011 | Gleason et al. |
| 7,898,273 B2 | 3/2011 | Gleason et al. |
| 7,898,281 B2 | 3/2011 | Andrews et al. |
| 7,934,944 B2 | 5/2011 | Hamada et al. |
| 7,934,945 B2 | 5/2011 | Narita et al. |
| 7,940,069 B2 | 5/2011 | Andrews et al. |
| 8,013,623 B2 | 9/2011 | Burcham et al. |
| 8,033,838 B2 | 10/2011 | Eldridge et al. |
| 8,202,684 B2 | 6/2012 | Hamada et al. |
| 8,373,428 B2 | 2/2013 | Eldridge et al. |
| 8,410,806 B2 | 4/2013 | Smith |
| 8,451,017 B2 | 5/2013 | Gleason et al. |
| 9,435,855 B2 | 9/2016 | Lewinnek et al. |
| 9,594,114 B2 | 3/2017 | Sinsheimer |
| 2002/0195265 A1 | 12/2002 | Miller et al. |
| 2003/0122538 A1 | 7/2003 | Parrish et al. |
| 2004/0196025 A1 | 10/2004 | Casey et al. |
| 2005/0223543 A1 | 10/2005 | Cohen et al. |
| 2006/0043986 A1* | 3/2006 | Hembree ............ G01R 1/07357 324/754.03 |
| 2006/0124927 A1 | 6/2006 | Groves et al. |
| 2007/0004238 A1 | 1/2007 | Breinlinger et al. |
| 2007/0007980 A1 | 1/2007 | Miller et al. |
| 2007/0103199 A1 | 5/2007 | Tzartzanis et al. |
| 2008/0061808 A1 | 3/2008 | Mok et al. |
| 2008/0100323 A1 | 5/2008 | Mayder |
| 2008/0157809 A1 | 7/2008 | Peng et al. |
| 2008/0265919 A1 | 10/2008 | Izadian |
| 2009/0033347 A1 | 2/2009 | Mineo et al. |
| 2010/0231250 A1 | 9/2010 | Breinlinger et al. |
| 2011/0095778 A1 | 4/2011 | Chou et al. |
| 2011/0234249 A1 | 9/2011 | Uematsu et al. |
| 2012/0017428 A1 | 1/2012 | Hsu et al. |
| 2012/0034820 A1 | 2/2012 | Lang et al. |
| 2012/0094534 A1 | 4/2012 | Motohashi et al. |
| 2012/0175612 A1 | 7/2012 | Ding et al. |
| 2012/0196062 A1* | 8/2012 | Sato ...................... F03G 7/005 428/35.2 |
| 2013/0135002 A1 | 5/2013 | Grover et al. |

(56) References Cited

U.S. PATENT DOCUMENTS

| | | | |
|---|---|---|---|
| 2014/0253159 A1* | 9/2014 | DeMille | G01R 1/07328 324/750.25 |
| 2015/0137848 A1 | 5/2015 | Lewinnek et al. | |
| 2015/0377946 A1 | 12/2015 | Sinsheimer | |

FOREIGN PATENT DOCUMENTS

| | | |
|---|---|---|
| WO | WO-88/05544 A1 | 7/1988 |
| WO | WO-2013/134568 A1 | 9/2013 |
| WO | WO-2015/200066 A1 | 12/2015 |

OTHER PUBLICATIONS

Chong et al., The Evolution of MCM Test from High Performance Bipolar Mainframe Multichip Modules to Low Cost Work Station Mulitchip Modules, ICEMM Proceedings '93, 404-410 (1993).

Davidson, E., Design, Analysis, Applications, IEEE Transactions on Components, Packaging, Manufacturing Technology—Part B: Advanced Packaging, 17(1): 2 (1994).

Doane, D.A., Foreword: Advancing MCM Technologies, IEEE Transactions on Components, Packaging, and Manufacturing Technology—Part B:Advanced Packaging, 17(1): 1 (1994).

Economikos et al., Electrical Test ofMultichip Substrates, IEEE Transactions on Components, Packaging, Manufacturing Technology—Part B: Advanced Packaging, 17(1): 56-61 (1994).

Fisher et al, Reducing Test Costs for High-Speed and High Pin-Count Devices, Probe Technology, 6 pages (Feb. 1992).

Fresh Quest Corporation, Fresh Quest Corporation Announces the Deliver of QC2TM Bare Die Carriers and QPC™ Probe Cards for the Production of Known Good Die, Chandler, AZ, 4 pages (Jul. 1, 1994).

Fresh Quest Corporation, Quest Pricing Guidelines, 1 page (1993-1994).

Hewlett Packard, High Speed Wafer Probing with the HP 83000 Model F660, 1-16 (1993).

Hughes Aircraft Company, Additional Technical Data for Hughes' Membrane Test Probe, Interconnect Systems Division, 1 page (1993).

Hughes Aircraft Company, Membrane Wafer Probe—The Future of the IC Test Industry, 24 pages.

International Search Report for PCT/US2014/063646, 3 pages (dated Jan. 28, 2015).

International Search Report for PCT/US2015/036213, 3 pages (dated Sep. 25, 2015).

Kister et al., Test Cost Reduction Using the Membrane Probe, Probe Technology, Santa Clara, CA, 6 pages.

Marshall et al., CAD-Based Net Capacitance Testing of Unpopulated MCM Substrates, IEEE Transactions on Components, Packaging, Manufacturing Technology—Part B: Advanced Packaging, 17(1):50-55 (Feb. 1994).

New Product Release: Reliant Switch for better RF testing, Dow Key.com (2010) URL: http://www.dowkey.com/news_details.php?id=110 [Retrieved on Feb. 3, 2015].

Packard Hughes Interconnect, Our New IC Membrane Test Probe. It's priced the Same, But It Costs Less., 1 page (1993).

Packard Hughes Interconnect, Science Over Art, Our New IC Membrane Test Probe, 6 pages (1993).

Probe Technology, Membrane Probe Card—The Concept, p. 7-18.

Probe Technology, Prober Interface Unit for HP83000 Model—INT768, 2 pages.

Ralston et al., Liquid-Metal Vertical Interconnects for Flip Chip Assembly of GaAs C-Band Power Amplifiers Onto Micro-Rectangular Coaxial Transmission Lines, IEEE Journal of Solid-State Circuits, 47(10): 2327-2334 (2012).

Reid et al., Micromachined Rectangular-Coaxial Transmission Lines, IEEE Transactions on Microwave Theory and Techniques, 54(8): 3433-3442 (2006).

Reliant Switch High Repeatability, DowKey.com, Data Sheet. URL: http://www.dowkey.com/_news_attach_files/0/_plk121_1_Reliant_Switch_Datasheet.pdf [Retrieved on Feb. 3, 2015].

Russell, T., Testing, IEEE Transactions on Components, Packaging, Manufacturing Technology—Part B: Advanced Packaging, 17(1):2 (Feb. 1994).

West, et al., Principles of CMOS VLSI Design: A Systems Perspective, 2nd Ed., Chapter 8: 513-625 (1993).

Written Opinion for PCT/US2014/063646, 10 pages (dated Jan. 28, 2015).

Written Opinion for PCT/US2015/036213, 6 pages (dated Sep. 25, 2015).

International Search Report for PCT/US2017/050695, ISA/KR, 3 pages (dated Dec. 20, 2017).

Written Opinion for PCT/US2017/050695, ISA/KR, 8 pages (dated Dec. 20, 2017).

* cited by examiner

TEST FIXTURE

TECHNICAL FIELD

This specification relates generally to a test fixture for interfacing a tester and a unit under test (UUT).

BACKGROUND

In-circuit test (ICT) may include testing a populated printed circuit board (PCB) to determine whether the PCB was properly assembled. For example, in-circuit testing may include performing tests to identify, on the PCB, short circuits, open circuits, wrong value components, unexpected resistance, capacitance, or inductance, and so forth. A test fixture acts as an interface between the PCB and test equipment used to perform in-circuit testing.

ICT operates by gaining electrical access to a PCB test through the test fixture. When performing electrical tests, each active and passive component is typically isolated from other surrounding components and tested on an individual basis. The PCB under test is designed to support this level of testability by incorporating test pads on signal nets that can be contacted by the test fixture.

The test fixture typically provides the physical and electrical interface between an ICT system and a unit under test (UUT), such as a PCB, as described above. One of the purposes of the test fixture is to translate, geographically, test pins of a test system's receiver interface to test pad locations on the UUT. This routing of electrical signals from the test system's receiver to the UUT test pads has historically been performed using interconnect methods within the test fixture. Perhaps the most widely used interconnect method in an ICT fixture includes direct wiring from a pin connecting to the tester to a POGO pin that contacts the test pad on the UUT. This type of test fixture is called a "wired fixture". Wired fixtures are generally considered to be lower cost fixtures, especially in one-off situations or in low volume usage.

Another type of interconnect method in an ICT fixture includes use of a PCB to route signals, rather than the individual wires as in a wired fixture. The type of test fixture that uses a PCB to route signals is called a "wireless fixture". Wireless fixtures are generally more expensive to manufacture than wired fixtures and are usually deployed only in higher-volume applications, where the price of designing and building a PCB can be amortized over multiple test fixtures.

Both of the foregoing types of test fixtures have a number of common drawbacks in that the time to develop the fixtures may be too long (e.g., on the order of three to eight weeks, depending upon node count and complexity), and that the cost may be higher than the market is willing to bear for a disposable buy item.

In this regard, one of the issues with ICT is the cost and development time associated with the test fixture. These test fixtures, whose cost can range from $10,000 to over $100,000, are typically unique to the specific board being tested and cannot be used to test any other board types. As a result, while the manufacturer may have only one or two ICT systems on a manufacturing line, it is likely the manufacturer has purchased tens to hundreds of different test fixtures, many of which have become obsolete as a result of short product lifetimes.

SUMMARY

An example test fixture is for interfacing a tester and a unit under test (UUT). The example test fixture comprises: first electrical contacts that face the tester; second electrical contacts that face the UUT; and a substrate comprised of sections of printed first material. The first material is electrically non-conductive; and the substrate is between the first electrical contacts and the second electrical contacts. The example test fixture also includes structures through the substrate. The structures comprise sections of second material. The second material is electrically conductive, and at least one of the structures electrically connects a first electrical contact and a second electrical contact. The example text fixture may also include one or more of the following features, either alone or in combination.

At least one of the structures within the substrate may have a section that is non-vertical and non-horizontal relative to upper and lower surfaces of the substrate. The first material may surround, and be in contact with, at least part of the first electrical contacts. The example text fixture may include a base plate holding the second electrical contacts. The sections of printed first material may be on the base plate. The base plate may comprise at least parts that are electrically non-conductive.

The first electrical contacts may comprise sections of printed third material. The third material may be electrically conductive and comprise a noble metal. The first electrical contacts may comprise pin receptacles for holding pins that mate to contacts of the UUT. The second material may comprise a silver-based material.

At least one of the structures may comprise the second material surrounded, at least in part, by a dielectric material. The dielectric material may be surrounded, at least in part, by conductive material. The example text fixture may include a top plate holding the first electrical contacts. The top plate may be attached to the substrate.

The first electrical contacts may comprise pins and the second electrical contacts may comprise pads. The first electrical contacts may have a layout that corresponds to a layout of contacts on the UUT. The second electrical contacts may have a layout that corresponds to a layout of contacts on part of the tester. The second material may comprise a combination of printed conductor and non-printed material.

An example method of forming a test fixture for interfacing a tester and a unit under test (UUT) comprises: forming a substrate and structures in the substrate at least in part through accumulation of sections of material, with at least some of the sections of material comprising electrically non-conductive material that forms the substrate and electrically-conductive material that forms the structures. The substrate is to be between first electrical contacts and second electrical contacts. The first electrical contacts face the tester, and the second electrical contacts face the UUT. At least one of the structures is formed to electrically connect a first electrical contact and a second electrical contact. The example method may also include one or more of the following features, either alone or in combination.

At least one of the structures within the substrate may be formed to have a section that is non-vertical and non-horizontal relative to upper and lower surfaces of the substrate. Forming the substrate may comprise accumulating the sections of material onto a base plate, with the base plate holding the second electrical contacts. Forming the substrate may comprise: holding the second electrical contacts in place using an apparatus; forming at least part of at least one of the sections around the second electrical contacts; waiting until the at least part of at least one of the sections anneals; and removing the apparatus.

The at least part of at least one of the sections may comprise a base section; and accumulating the sections may comprise forming additional sections on top of the base section. The first electrical contacts may be formed through the accumulation of the sections of material, with at least some of the sections comprising electrically-conductive material that forms the first electrical contacts.

The example method may comprise: arranging the first electrical contacts to have a layout that corresponds to a layout of contacts on the UUT; and arranging the second electrical contacts to have a layout that corresponds to a layout of contacts on part of the tester. The first electrical contacts may comprise pin receptacles for holding pins to mate to contacts of the UUT. At least one of the structures may be formed of the electrically-conductive material surrounded, at least in part, by a dielectric material, with the dielectric material being surrounded, at least in part, by another electrically-conductive material.

The example method may comprise pressing at least one of the first electrical contacts or the second electrical contacts into the substrate. The example method may comprise attaching a top plate to the substrate. The top plate may hold the first electrical contacts; and the top plate may be attached so that the first electrical contacts form an electrical connection to corresponding structures at locations of the first electrical contacts. The electrically-conductive material may comprise a combination of printed conductor and non-printed material.

The foregoing may reduce the cost of an ICT cell and also may reduce the time to construct an appropriate test fixture.

Any two or more of the features described in this specification, including in this summary section, can be combined to form implementations not specifically described herein.

The systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and computer memory to store executable instructions to implement various operations.

The details of one or more implementations are set forth in the accompanying drawings and the description below. Other features and advantages will be apparent from the description and drawings, and from the claims.

DETAILED DESCRIPTION

Figure 1:
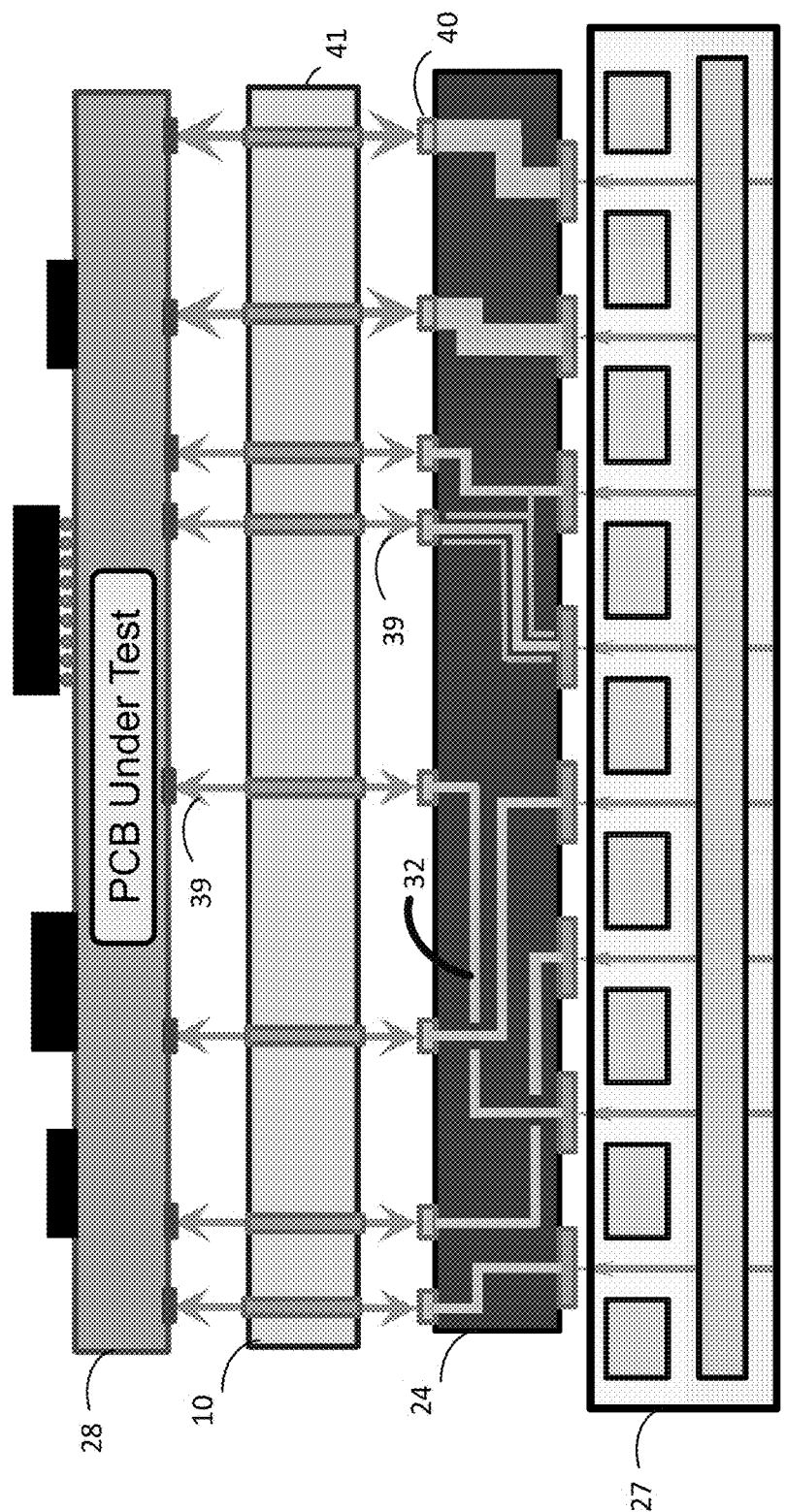
FIG. 1 is a block diagram of an example test fixture that includes a top plate between an additively-manufactured structure and a UUT.

In-circuit test (ICT) may be used to identify manufacturing process defects and component defects on populated printed circuit board (PCB) assemblies. ICT systems (or simply, test systems) may obtain access to a unit under test (UUT), such as a PCB, through a test fixture (also called a test fixture interface). When performing electrical tests, active and passive components on a UUT are typically isolated from other surrounded components and tested on an individual basis. The PCB is configured to support this level of testability by incorporating test pads that can be contacted by corresponding electrical contacts on the test fixture.

The example test fixtures described herein provide the physical and electrical interface between the test system and the UUT—in the examples described herein, a PCB. The example test fixtures may be configured to route signals between test pins of the ICT system's receiver interface and test pad locations on the UUT.

The test fixtures may be produced using an additive manufacturing process, such as three-dimensional (3D) printing. For example, a test fixture may be, or include, an interface (called an interconnect or translator) that is additively-manufactured using co-printed dielectric material (e.g., electrically non-conductive material) and electrically-conductive material. The electrically-conductive (or, simply "conductive") material may include, but is not limited to, heavily-loaded silver particles in a thermoplastic or thermoset matrix. Silver and other noble metals may be used because their oxides, that may appear over time, are also conductive. Alternatively, conductive materials such as copper or copper alloys can be used. In cases where materials such as these are used, the additive manufacturing process may be performed in an inert atmosphere, such as Nitrogen ($N_2$), so that oxidation over time of the base conductive material is inhibited.

In some implementations, electrically non-conductive (or, simply "non-conductive") layers are printed on a base plate. The base plate may become part of the test fixture, or it may be removed, as described herein. In an example, the lower test fixture interface to the test system is implemented by the base plate. For example, the base plate may provide the mechanical and electrical foundation upon which layers of material may be added by additive manufacturing to form the test fixture. In some implementations, the base plate includes electrical contacts, that are configured and arranged to mate to corresponding electrical contacts on the ICT system (or test system) receiver and to mate to correspondingly arranged vias in the test fixture. Material forming the non-conductive parts of the test fixture interface is applied around electrical contacts on the base plate, and surrounds those contacts. Thereafter, conductive and non-conductive material is accumulated over the resulting structure, in layers, to form the test fixture. In some implementations, the base plate is used as an initial structure on which layers are accumulated, and is subsequently removed, with appropriate test system contacts added to, or formed in, the test fixture.

Electrical interconnection among multiple additively-manufactured layers may be implemented through inter-layer structures. Examples of such inter-layer structures include, but are not limited to, conductors, such as vias, which are formed in, or added to, the test fixture. In some cases, the vias can be "blind" (surface layer to inner layer), or "buried" (inner layer to inner layer). Transmission of signals, including high-speed or low-signal-level signals, may benefit from additively-manufactured conduits. That is, through additive manufacturing, conductors may be formed that are shielded, coaxial, and that have a controlled characteristic impedance. Signal transmission may be improved through use of conductors such as these.

In some implementations, the test fixture may be additively-manufactured directly upon target pads (or "brads") or cups, without using a base plate, as described herein, to support the test brads. As described above, in some implementations, a temporary unit (which may be a base plate or other type of apparatus) that is comprised of any appropriate rigid material may be used to mechanically retain the interface brads in place while the additive manufacturing (e.g., 3D printing) process begins. Once the printing, or at least a portion thereof, has been completed and the printed material has cured, the temporary unit can be removed and re-used for to form subsequent test fixtures.

In some implementations, test system POGO pins, which may be located in the test system receiver, directly connect to electrical contacts on the bottom of the test fixture. In some implementations, the electrical contacts on the bottom of the test fixture may be pads (or brads). These pads may be printed with thick, hard material in order to withstand the repeated contact force of the tester POGO pins. In some implementations, POGO pin receptacles may be used in place of pads.

In some implementations, the top of the test fixture includes an electrical path to POGO pins or other electrical contacts that ultimately mate to UUT test pads. The electrical contacts may be implemented in several ways, depending upon the process capabilities and cost targets of the manufacturer. In some implementations, thick pads are printed and may include gold, e.g., a hard gold finish, to promote improved electrical conductivity and resistance to oxidation that may otherwise negatively impact contact reliability. In some implementations, noble metals other than gold may be used.

Figure 2:
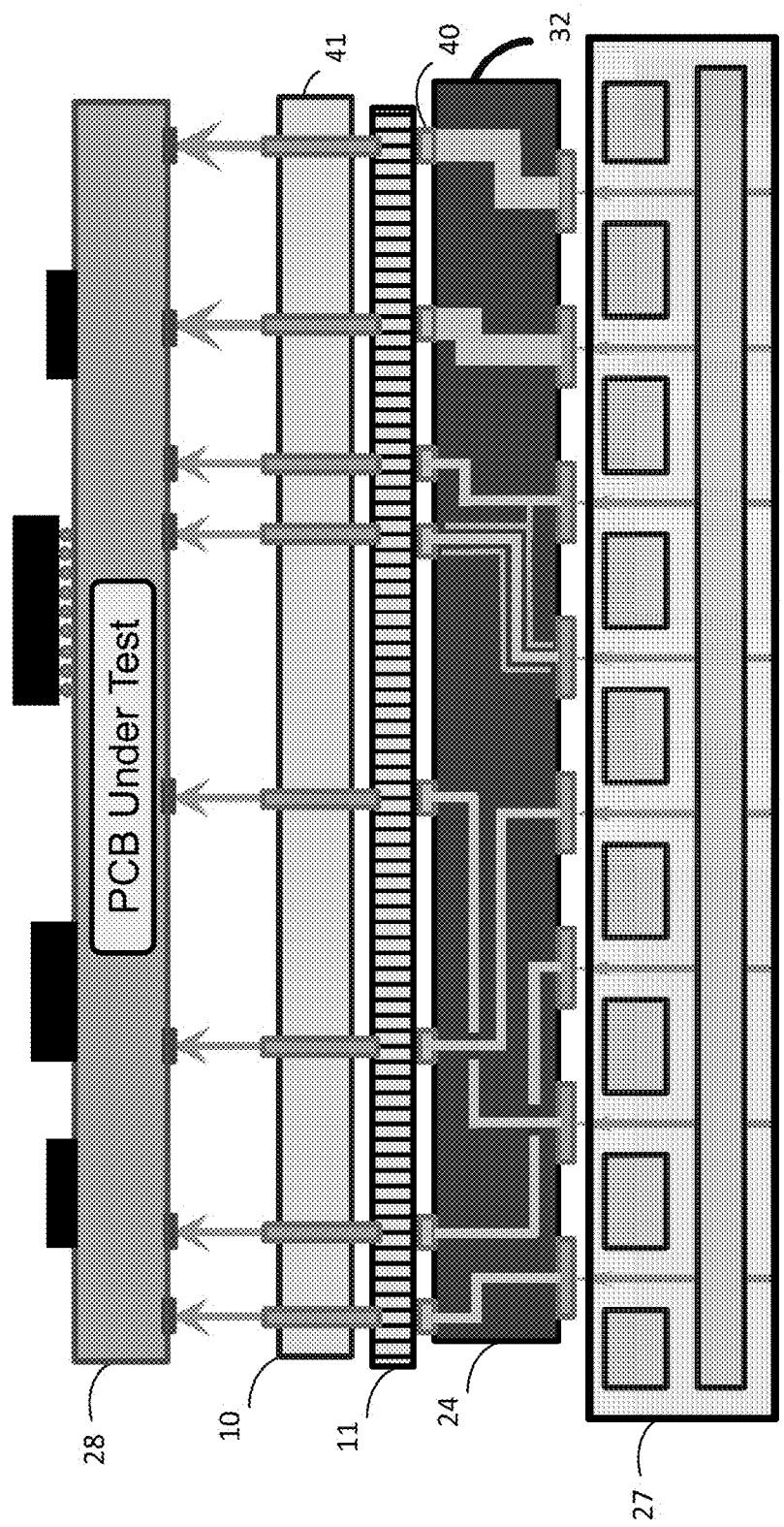
FIG. 2 is a block diagram of an example test fixture that includes a Z-axis anisotropic conductor between a top plate a UUT.

In some implementations, an interconnect vehicle between the test fixture and the UUT test pads may include a top plate 10 comprising a double sided POGO pin structure that is mechanically held in a fixed geographic location relative to the UUT (see, e.g., FIG. 1), or may include a Z-axis anisotropic conductor 11 that is arranged above the additively-manufactured structure and allows a single ended POGO pin, mounted in a receptacle, to facilitate the last section of interconnect to the UUT test pads (see, e.g., FIG. 2). The Z-axis conductor pad may be, or include, a flexible insulating rubber material that has a multiplicity of fine, closely-spaced metal wire conductors placed in the flexible insulating material. This material provides the compliancy that would otherwise have been provided by the lower half of a double-sided POGO pin.

In some implementations, POGO pin receptacles that normally reside in a drilled POGO pin carrier can be temporarily held in place by a holder during additive manufacturing of the test fixture interface, allowing them to become a permanent part of the test fixture, rather than part of a carrier plate. This eliminates the cost of a carrier plate and the cost of the drilling holes in the carrier plate. An example implementation of such a test fixture to interface between a test system and a UUT, which may reduce both fixture cost and signal path length, is shown in FIG. 3.

Figure 3:
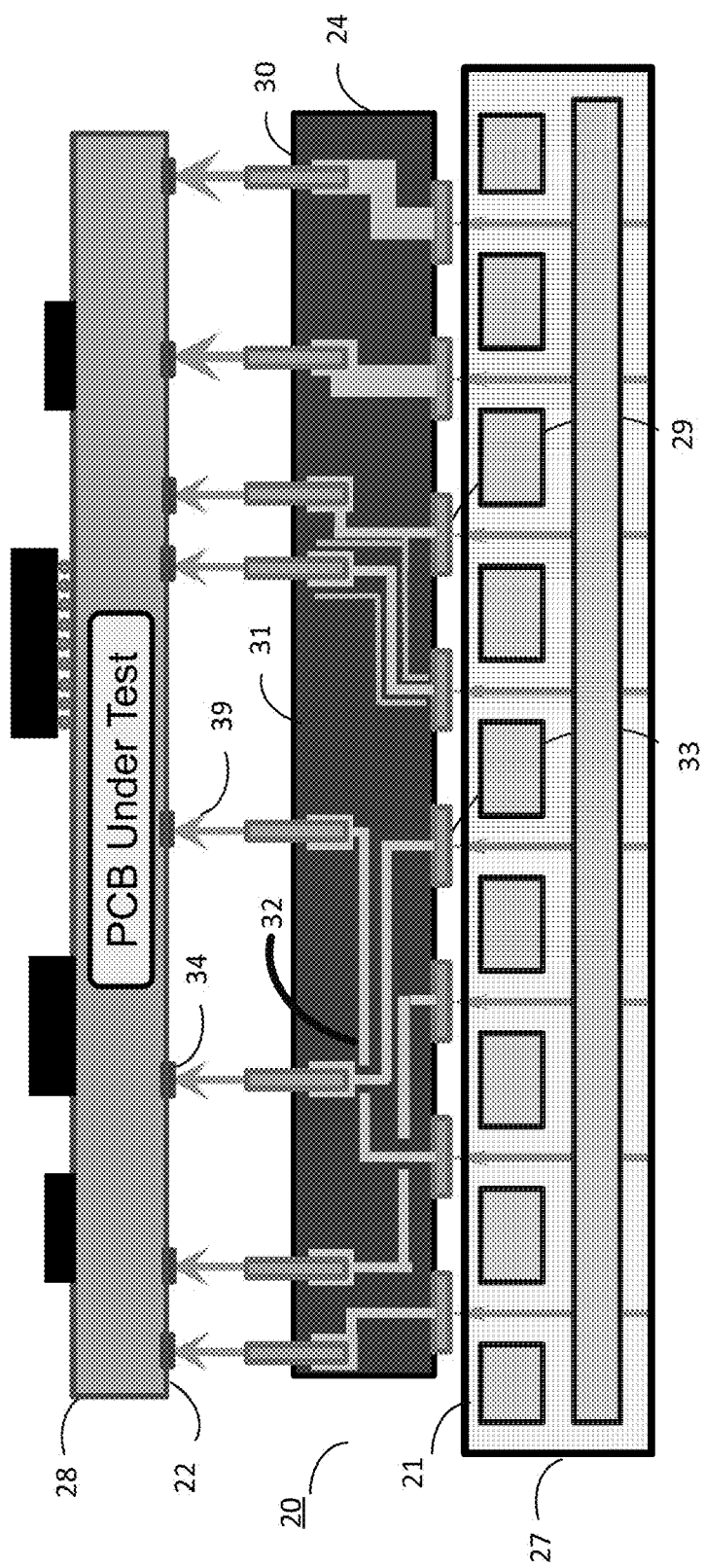
FIG. 3 is a block diagram of an example test fixture that includes contacts to a UUT directly on an additively-manufactured structure.

Referring to FIG. 3, electrical connections between test pins of the test system's receiver interface and test pad locations on the UUT are implemented through conductive structures that are created, in whole or in part, through an additive manufacturing (e.g., 3D printing) process. In some implementations, the structures are only partly created through additive manufacturing, and may be incorporated into the substrate of a test fixture interface through other process(es). For example, metal may be added to holes in the substrate to create all or part of the conductive structures.

As explained, example structures include, but are not limited to, one or more vias that are electrically conductive. As noted, the substrate and structures in the substrate may be formed, in whole or in part, through accumulation of layers of material. During an example additive manufacturing process, layers are deposited, one on top of the other. Each layer may include conductive and non-conductive materials, arranged so as to form the substrate and structures, through accumulation of layers, at appropriate locations within the test fixture. As the layers are deposited, e.g., using a 3D printer or other appropriate additive manufacturing device, the type of material being deposited changes at appropriate locations. For example, in areas of a layer that are to be part of the substrate, non-conductive material is deposited, and in areas of the layer that are to be a conductive structure, conductive material is deposited.

Figure 4:
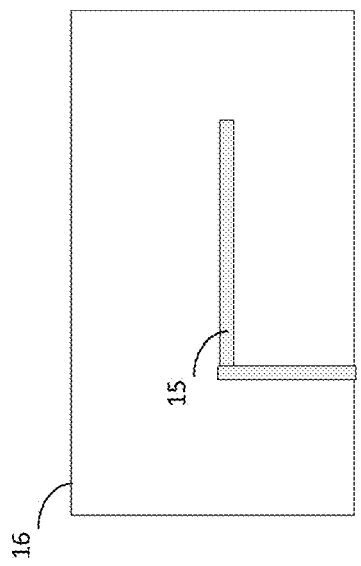
FIG. 4 is a block diagram of an example buried conductive structure.
Figure 5:
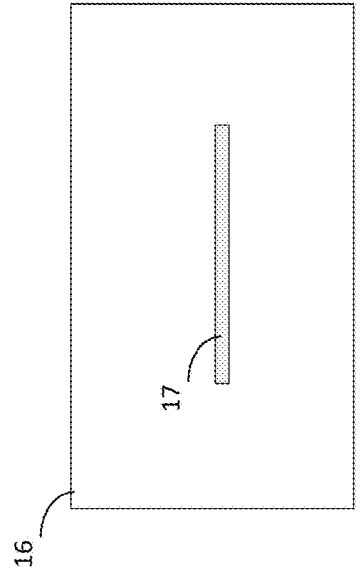
FIG. 5 is a block diagram of an example hidden conductive structure.

As in the examples described above, conductive structures can pass all the way through the test fixture in order to connect electrical contacts on the test system to electrical contacts on the UUT. In some cases, however, structures need not pass all the way through a fixture. For example, a blind structure may electrically connect one external electrical contact (such as a contact to the test system or to the UUT) to an internal conductive layer or structure. FIG. 4 shows an example blind structure 15 within a substrate 16 that is part of a test fixture interface. As shown, blind structure 15 does not pass all the way through the fixture and, thus, does not directly connect a contact on the test system to a contact on the UUT (an indirect connection, however, may result through an electrical pathway that includes the internal conductive layer). A hidden structure may electrically connect two internal conductive layers and/or structures. FIG. 5 shows an example of a hidden structure 17 within substrate 16.

Figure 6:
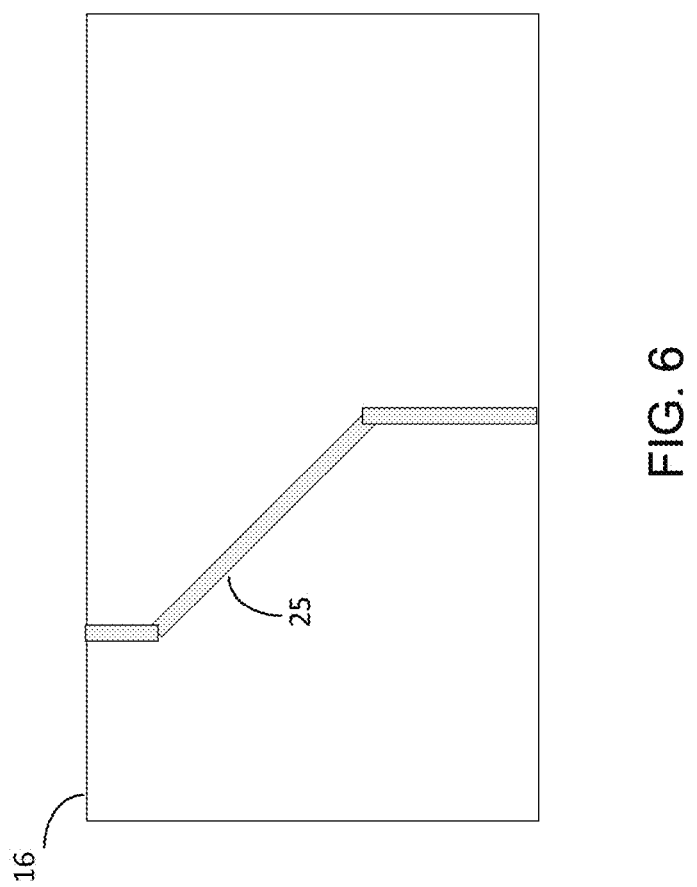
FIG. 6 is a block diagram including an example diagonal conductive structure.

As noted, in some implementations, the conductive structures are vias. Some vias may be formed (e.g., printed) horizontally and vertically, as measured relative to the top plane 21 of the tester and the bottom plane 22 of the UUT, or as measured relative to the upper and lower surfaces of the substrate 24 that forms the test fixture 20 (see, e.g., FIG. 3). Some vias may be formed diagonally, and may contain one or more angles or undulating curves as measured relative to the top plane 21 of the tester and the bottom plane 22 of the UUT, or as measured relative to the upper and lower surfaces of the substrate 24 that forms the test fixture. The vias thus may also be, in whole or in part, non-vertical and/or non-horizontal. For example, FIG. 6 shows an example of a via 25 that is formed diagonally within a substrate 16 (which may be an example of, or part of, substrate 24) using additive manufacturing within an interface. Vias that are not limited to horizontal and vertical sections may provide a more direct conductive path between pins or other contacts on the tester and the UUT.

Referring to FIG. 3 (but as also shown in FIGS. 1 and 2), in an example implementation, a test fixture 20 interfaces a tester 27 and a UUT 28. Test fixture 20 includes electrical contacts 29 that face the tester, and electrical contacts 30 that face the UUT. Test fixture 20 also includes substrate 24 comprised of sections of additively-manufactured (e.g., 3D-printed) non-conductive material 31 that is at least partly between electrical contacts 29 and electrical contacts 30.

The non-conductive material provides rigidity, and supports the electrical contacts and the conductive structures (e.g., vias) that pass signals between the tester and the UUT. As noted, conductive structures 32 may be formed by additive manufacturing (e.g., 3D printing) at appropriate times during formation of the substrate by switching the material used during printing, e.g., from the non-conductive material that forms the substrate to the conductive material that forms vias. In some implementations, this is done layer-by-layer, such that a single layer contains both conductive and non-conductive parts at appropriate locations which, when combined with upper and lower layers, additively form the vertical structures depicted in the figures. The test fixture thus includes conductive structures through the substrate, which are formed by accumulation of conductive material (e.g., by 3D printing). As shown, e.g., in FIG. 3, one or more of the conductive structures 32 electrically connects, e.g., provides an electrical pathway between one or more contacts 33 on test fixture 20 and one or more contacts 34 on the UUT. Connection between the UUT and the test fixture is depicted by arrows 39

In the example of FIG. 3, conductive structures 32 are vias that provide the electrical pathway between electrical contacts 29—brads or pads, in this example—that provide interface to test fixture 20 and pins, e.g., POGO pins, that interface to the UUT. In some implementations, electrical contacts 29 and electrical contacts 30—which are pin receptacles, in this example—may be part of the test fixture, e.g., the substrate and vias may be formed around the pin receptacles and brads, or the pin receptacles and brads may be inserted or implanted into the test fixture as described herein. For example, test fixture 20 may be formed with one or more brads and/or one or more pin receptacles to enable electrical between the test system and the UUT through conductive structures (e.g., vias) in the test fixture. As noted, the conductive structures may be formed of any appropriate conductive material, such as silver-based material.

In some implementations, one or more of the conductive structures (e.g., the vias) includes the conductive material surrounded, in whole or part, by a dielectric material, and the dielectric material is surrounded, in whole or part, by conductive material. That is, one or more of the vias may be coaxial, with the internal conductive material forming the signal path and a concentric outer material (with a dielectric between the two) forming the return path. Any appropriate dielectric may be used, such as air or the material otherwise used to form the non-conductive parts of the substrate.

As described above, a base plate may hold electrical contacts 29 to the test fixture. Sections of printed non-conductive material are formed on the base plate, and then the vias are formed to connect, electrically, to the contacts on the base plate. In some implementations, the base plate, aside from the electrical contacts thereon, is formed of a non-conductive material that is sufficiently rigid to support additive manufacturing thereon. The non-conductive material of the base plate may be the same as, or different from, the non-conductive material of the test fixture (the substrate).

In some implementations, a top plate holds the electrical contacts to the UUT. For example, the top plate may hold pin receptacles to which POGO pins on the UUT interface. The top plate may be attached to substrate 24 in any appropriate manner. For example, FIG. 1 shows pin receptacles on a top plate 10 that attaches to the printed structure comprising substrate 24 and conductive structures 32. The directions of attachments are shown by arrows 39. In the example of FIG. 1, the printed structure includes electrical contact pads (or brads) 40 also on its top, which interface to pins/pin receptacles 41 on the top plate. The contacts pads may be deposited contacts or otherwise formed. In this example, the test fixture thus may include the additively-manufactured structure, which contains the substrate, the brads, and the vias, along with the top plate 10. The remainder of the test fixture of FIG. 1 may be identical to, or similar to, the implementation of FIG. 3.

In some implementations, as shown in FIG. 2, there may be a Z-axis anisotropic conductor 11 between contact pads 40 and top plate 10. The z-axis anisotropic conductor 11 may be made of a conductive material and may route signals between contact pads 40 and pins/pin receptacles 41. The remainder of the test fixture of FIG. 2 may be identical to, or similar to, the implementation of FIG. 1.

Referring back to FIG. 3, in some implementations, electrical contacts (e.g., contact pads or pin receptacles) on the top of fixture 20 have a layout that corresponds to a layout of contacts on the UUT; and the electrical contacts (e.g., contact pads or pin receptacles) on the bottom of the test fixture have a layout that corresponds to a layout of contacts on part of the tester (e.g., the test system receiver). Configurations such as this facilitate connection between the tester, the test fixture, and the UUT.

Figure 7:
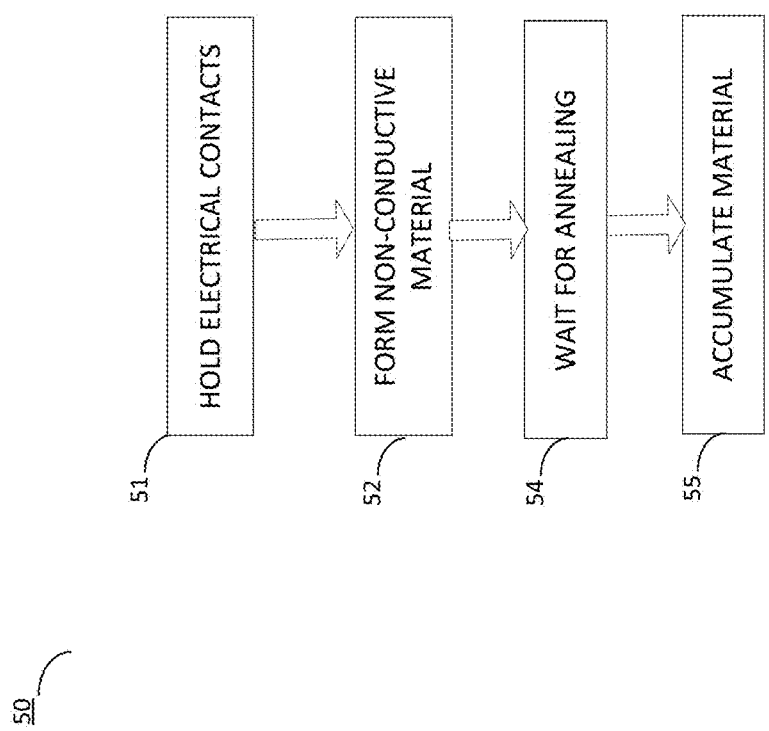
FIG. 7 is a flowchart showing an example process for forming an additively-manufactured test fixture.

Referring to FIG. 7, an example process 50 for forming a test fixture, such as the examples shown in FIGS. 1 to 6, includes forming a substrate and structures in the substrate at least in part through accumulation of sections (e.g., layers) of conductive and non-conductive material. That is, at least some of the sections of material include electrically non-conductive material that forms the substrate and electrically-conductive material that forms the structures (e.g., the vias). Example process 50 includes holding (51) electrical contacts to the UUT in place using a device, such as a base plate; forming (52) at least part of the non-conductive material around the electrical contacts; waiting (53) until the non-conductive material anneals; and removing the device or leaving it in place. That is, in some implementations, the device (e.g., the base plate) is left in place and becomes part of the test fixture. In examples such as this, the electrical contacts pass through the test plate to enable electrical connection between contacts on the tester and vias formed in the test fixture as described herein.

In any event, to form conductive and non-conductive parts of the test fixture, layers of conductive and/or non-conductive material are accumulated (54). Depending upon the structures that they are to form, individual layers may include non-conductive material only, a combination of conductive and non-conductive material, or conductive material only. In some implementations, the formation process includes forming conductive structures (e.g., vias) using a combination of accumulated material and other, added, conductive material. For example, a part of a via may be formed through additive manufacturing, and holes may be left in the substrate that connect to the formed part of the via. Conductive material may be added to the holes to complete formation of the via. In some implementations, the test fixture may include some vias formed solely by additive manufacturing, some vias formed by addition of metal to holes (e.g., by non-additive manufacturing processes), and some vias may be formed through a combination of additive manufacturing and non-additive manufacturing processes. Vias are connected to appropriate conductive pads to form electrical pathways.

In some implementations, electrical contacts (e.g., contact pad or pin receptacles) are arranged on the top of the fixture to have a layout that corresponds to a layout of contacts on the UUT; and the electrical contacts (e.g., pins or pins receptacles) are arranged on the bottom of the fixture to have a layout that corresponds to a layout of contacts on part of the tester. The electrical contacts on the top and/or the bottom of the fixture may be, or include, one or more of contact pads, contact pins, pin receptacles, or any other appropriate mechanism that enables formation of an electrical connection. Pin receptacles are configured to receive, and to hold, pins to create electrical contact. In some implementations, the contacts may be added by pressing or otherwise incorporating the contacts into a resulting printed fixture or substrate. In any event, vias through substrate connect contacts on the top and bottom of the fixture.

As explained above, in some implementations, one or more of the conductive structures (e.g., the vias) comprises the conductive material surrounded, at least in part, by a dielectric material, and the dielectric material surrounded, at least in part, by conductive material. This may be achieved, for example, through appropriate accumulation of material during formation by additive manufacturing.

In some implementations, process 50 may include attaching a top plate to the resulting test fixture. As described with respect to FIG. 1, the top plate may include contacts that create an electrical connection between the test fixture and contacts on the UUT. As described with respect to FIG. 2, the process may include incorporating a Z-axis conductor between the top plate and the additively-manufactured structure.

Test fixtures that utilize an additively-manufactured interface may be configured to support a range of interconnect paths, typically from as few as several hundred connections to as many as, e.g., 15,000, connections, and can help lower the recurring cost of in-circuit test cell on the manufacturer's PCB, or other, assembly line.

Testing performed by the example test system described herein may be implemented using hardware or a combination of hardware and software. For example, a test system like the ones described herein may include various controllers and/or processing devices located at various points in the system to control operation. A central computer may coordinate operation among the various controllers or processing devices.

The test system may be controlled by one or more computers, e.g., by sending signals to and from one or more wired and/or wireless connections to each test slot. The testing can be controlled, at least in part, using one or more computer program products, e.g., one or more computer program tangibly embodied in one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) may include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any electrical connection involving transfer of signals may imply a direct physical connection or a wired or wireless connection that includes intervening components but that nevertheless allows electrical signals to flow between connected components. Any connection of electrical circuitry that enables signals to pass, unless stated otherwise, is an electrical connection and not necessarily a direct physical connection regardless of whether the word electrical is used to modify connection.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test fixture for interfacing a tester and a unit under test (UUT), the test fixture comprising:
    first electrical contacts that face the tester;
    second electrical contacts that face the UUT;
    a substrate comprised of sections of printed first material, the first material being electrically non-conductive, the substrate being between the first electrical contacts and the second electrical contacts; and
    structures through the substrate, the structures comprising sections of second material, the second material being electrically conductive, at least one of the structures electrically connecting a first electrical contact and a second electrical contact.

2. The test fixture of claim 1, wherein at least one of the structures within the substrate has a section that is non-vertical and non-horizontal relative to upper and lower surfaces of the substrate.

3. The test fixture of claim 1, wherein the first material surrounds, and is in contact with, at least part of the first electrical contacts.

4. The test fixture of claim 1, further comprising:
    a base plate holding the second electrical contacts, the sections of printed first material being on the base plate, the base plate comprising at least parts that are electrically non-conductive.

5. The test fixture of claim 1, wherein the first electrical contacts comprise sections of printed third material, the third material being electrically conductive and comprising a noble metal.

6. The test fixture of claim 5, wherein the first electrical contacts comprise pin receptacles for holding pins that mate to contacts of the UUT.

7. The test fixture of claim 1, wherein the second material comprises a silver-based material.

8. The test fixture of claim 1, wherein at least one of the structures comprises the second material surrounded, at least in part, by a dielectric material, the dielectric material being surrounded, at least in part, by conductive material.

9. The test fixture of claim 1, further comprising:
a top plate holding the first electrical contacts, the top plate being attached to the substrate.

10. The test fixture of claim 1, wherein the first electrical contacts comprise pins and the second electrical contacts comprise pads.

11. The test fixture of claim 1, wherein the first electrical contacts have a layout that corresponds to a layout of contacts on the UUT; and
wherein the second electrical contacts have a layout that corresponds to a layout of contacts on part of the tester.

12. The test fixture of claim 1, wherein the second material comprises a combination of printed conductor and non-printed material.

13. A method of forming a test fixture for interfacing a tester and a unit under test (UUT), the method comprising:
forming a substrate and structures in the substrate at least in part through accumulation of sections of material, at least some of the sections of material comprising electrically non-conductive material that forms the substrate and electrically-conductive material that forms the structures;
wherein the substrate is to be between first electrical contacts and second electrical contacts, the first electrical contacts facing the tester, and the second electrical contacts facing the UUT, at least one of the structures being formed to electrically connect a first electrical contact and a second electrical contact.

14. The method of claim 13, wherein at least one of the structures within the substrate is formed to have a section that is non-vertical and non-horizontal relative to upper and lower surfaces of the substrate.

15. The method of claim 13, wherein forming the substrate comprises:
accumulating the sections of material onto a base plate, the base plate holding the second electrical contacts.

16. The method of claim 13, wherein forming the substrate comprises:
holding the second electrical contacts in place using an apparatus;
forming at least part of at least one of the sections around the second electrical contacts;
waiting until the at least part of at least one of the sections anneals; and
removing the apparatus.

17. The method of claim 16, wherein the at least part of at least one of the sections comprises a base section; and
wherein accumulating the sections comprises forming additional sections on top of the base section.

18. The method of claim 13, wherein the first electrical contacts are formed through the accumulation of the sections of material, at least some of the sections comprising electrically-conductive material that forms the first electrical contacts.

19. The method of claim 13, further comprising:
arranging the first electrical contacts to have a layout that corresponds to a layout of contacts on the UUT; and
arranging the second electrical contacts to have a layout that corresponds to a layout of contacts on part of the tester.

20. The method of claim 13, wherein the first electrical contacts comprise pin receptacles for holding pins to mate to contacts of the UUT.

21. The method of claim 13, wherein at least one of the structures is formed of the electrically-conductive material surrounded, at least in part, by a dielectric material, the dielectric material being surrounded, at least in part, by another electrically-conductive material.

22. The method of claim 13, further comprising:
pressing at least one of the first electrical contacts or the second electrical contacts into the substrate.

23. The method of claim 13, further comprising:
attaching a top plate to the substrate, the top plate holding the first electrical contacts, the top plate being attached so that the first electrical contacts form an electrical connection to corresponding structures at locations of the first electrical contacts.

24. The method of claim 13, wherein the electrically-conductive material comprises a combination of printed conductor and non-printed material.

* * * * *